United States Patent [19]
Learmonth

[11] Patent Number: 6,049,468
[45] Date of Patent: Apr. 11, 2000

[54] PC CARD SECOND GENERATION SHIELDING

[75] Inventor: Iain Thomas Learmonth, Basingstoke, United Kingdom

[73] Assignee: ITT Manufacturing Enterprises, Inc., Wilmington, Del.

[21] Appl. No.: 09/153,596

[22] Filed: Sep. 15, 1998

[30] Foreign Application Priority Data

Oct. 13, 1997 [EP] European Pat. Off. .............. 97308090

[51] Int. Cl.$^7$ ...................................................... H05K 9/00
[52] U.S. Cl. ........................ 361/816; 361/799; 361/752; 361/800; 361/737; 174/35 R; 174/35 GC
[58] Field of Search .................................... 361/736, 752, 361/796, 799, 800, 816, 818; 174/35 R, 35 GC, 35 MS; 206/719

[56] References Cited

U.S. PATENT DOCUMENTS

| | | | |
|---|---|---|---|
| 5,005,106 | 4/1991 | Kiku ......................................... | 361/424 |
| 5,323,299 | 6/1994 | Weber ...................................... | 361/818 |
| 5,339,222 | 8/1994 | Simmons et al. ......................... | 361/818 |

FOREIGN PATENT DOCUMENTS 14 41 114  9/1962  Germany .

OTHER PUBLICATIONS

"Taking a Good Idea into Production" Electronic Engineering, vol. 68, No.830, Feb., 1996, p. EMC 8 XP000556581 *the whole document*.

Primary Examiner—Leo P. Picard
Assistant Examiner—Jayprakash N. Gandhi
Attorney, Agent, or Firm—Thomas L. Peterson

[57] ABSTRACT

A PC card with a circuit board (14) and sheet metal cover parts (16, 17), is provided with a shielded volume (23, 29) where a circuit component (24) is isolated from circuit components outside the shielded volume. An internal shield (18) of electrically conductive material surrounds the shielded volume, and is engaged with a ground trace (28) on the circuit board. The internal shield is flexible so it bends when the sheet metal cover parts bend, to avoid breaking the circuit board. Layers of electrically conductive adhesive (42, 44, 46) couple the internal shield to the circuit board into one of the cover parts. A plate-like shielding device (40) can be provided, that includes a metal foil (41) that is bonded to the internal shield and that lies over the entire shielded volume.

15 Claims, 4 Drawing Sheets

PC CARD SECOND GENERATION SHIELDING

BACKGROUND OF THE INVENTION

The present invention relates to PC cards used to provide additional circuitry and external connections for computers and other electrical devices. PC cards (cards with printed circuits) are commonly made in accordance with PCMCIA (Personal Computer Memory Card International Association) specifications which define, among other things, the dimensions of such card. One of the critical dimensions is the maximum thickness of the cards, the maximum thickness being 5 mm for the common Type II PC cards, which permits the cards to be inserted into a standard receiving slot of an electrical device such as a laptop computer. Such PC cards normally include a housing having top and bottom sheet metal cover parts (which may be integrally joined at one end), a printed circuit board holding circuit components and contained within the housing, and a front connector at a front end of the card. The front connector mates with a device connector at the front end of the insertion slot to connect to circuitry on the circuit board. The housing is intended to provide shielding, or screening, against electromagnetic radiation passing into or out of the PC card.

Circuitry, including circuit components (e.g. integrated circuits, capacitors, conductors, and resistors, which all affect currents passing therethrough) sometimes require electromagnetic isolation from other circuitry to prevent cross coupling. Such shielding or screening must remain intact after mechanical flexing of the PC card, which normally occurs in use. PCMCIA specifications describe a "torque test" and "bend test" which cards must survive to simulate this phenomenon. One way of providing screening is to employ a number of shielding inner covers that fit over interfering circuitry and which are coupled to a grounding trace on the circuit board. Such covers are unreliable due to their resistance to flexing and a consequent risk of damage to the circuit board during flexing of the PC card.

Applicants have tried to provide internal shielding by using conductive elastomer to form a wall around the circuitry to be screened. Such elastomer wall is sandwiched between a grounding trace on the circuit board and a cover part, and is compressed between them. In this way, the elastomer wall and the cover part form an effective screen for the circuitry lying within the wall. A problem with this construction is that it does not provide sufficient compression force between the cover part and circuit board to ensure reliable low resistance contact, without bulging out the cover part. The cover parts are typically formed of thin sheet metal such as stainless steel, to limit the overall thickness of the card while leaving space for the circuit board and the circuit components. As a result, even a low force can result in the cover outer surfaces becoming convex so the cover bulges. Bulging covers can result in the card thickness increasing beyond the specified maximum thickness, as well as resulting in a card appearance which is unsightly and which suggests damage. The present invention seeks to provide a solution to the above problem.

SUMMARY OF THE INVENTION

In accordance with one embodiment of the invention, a PC card is provided with enhanced internal shielding. The PC card includes a housing having top and bottom sheet metal cover parts, a printed circuit board mounted in the housing, and at least one flexible electrically conducted internal shield. The internal shield lies between the circuit board and one of the cover parts, and is held in place by an electrically conductive adhesive to one, or both, of the cover and the corresponding trace on the circuit board.

The use of a conductive adhesive ensures that there is reliable low resistance electrical connection between the internal shield and the grounding trace on the board, and preferably also the cover, without requiring compressive force on the conductive shield or at least without requiring a sufficient magnitude of such force as would noticeably distort the thin metallic cover parts. The construction also permits the shield to act as an accurate spacer to maintain a more constant thickness of the PC card and thereby resist flexing of the PC card without damage to the circuit board.

The adhesive employed on at least one side of the internal shield may be releasable to permit opening of the PC card without damage to the circuit board or the internal shield. The adhesive employed on the opposite side of the shield may be a permanent nonreleaseable type to maintain securement of the shield.

Each internal shield may be formed from a conductive elastomer which may contain, for example, particles of silver to render it conductive. Each shield may be molded to define walls providing one or more enclosures for components on the board.

A plate-like shielding device preferably covers the top of the internal shield. The shielding device preferably includes a metal foil and a layer of a conductive adhesive bonding the foil to the upper face of the internal shield, with the foil extending over the entire shielding volume enclosed by the internal shield. The foil is also preferably bonded to the upper cover part.

A method of manufacturing a PC card includes securing at least one flexible conductive internal shield to a ground trace on the circuit board and/or one of the sheet metal cover parts, by means of a conductive adhesive when installing the board in the housing. The method may include the step of securing a similar second flexible conductive shield to the other cover part by means of a conductive adhesive, so the second shield is disposed between the board and the other cover part.

The method may include the additional step of providing conductive adhesive on both sides of a metal foil to form a shielding part. The internal shield is attached to the cover by attaching one adhesive layer on the foil to one of the cover parts and the other adhesive layer on the foil to the conductive internal shield. In a particularly advantageous manufacturing environment, the method may include the additional step of releasably attaching the shields on a carrier liner strip from which they are transferred to a cover or circuit board during manufacture.

The novel features of the invention are set forth with particularity in the appended claims. The invention will be best understood from the following description when read in conjunction with the accompanying drawings.

DESCRIPTION OF THE PREFERRED EMBODIMENTS

Figure 1:
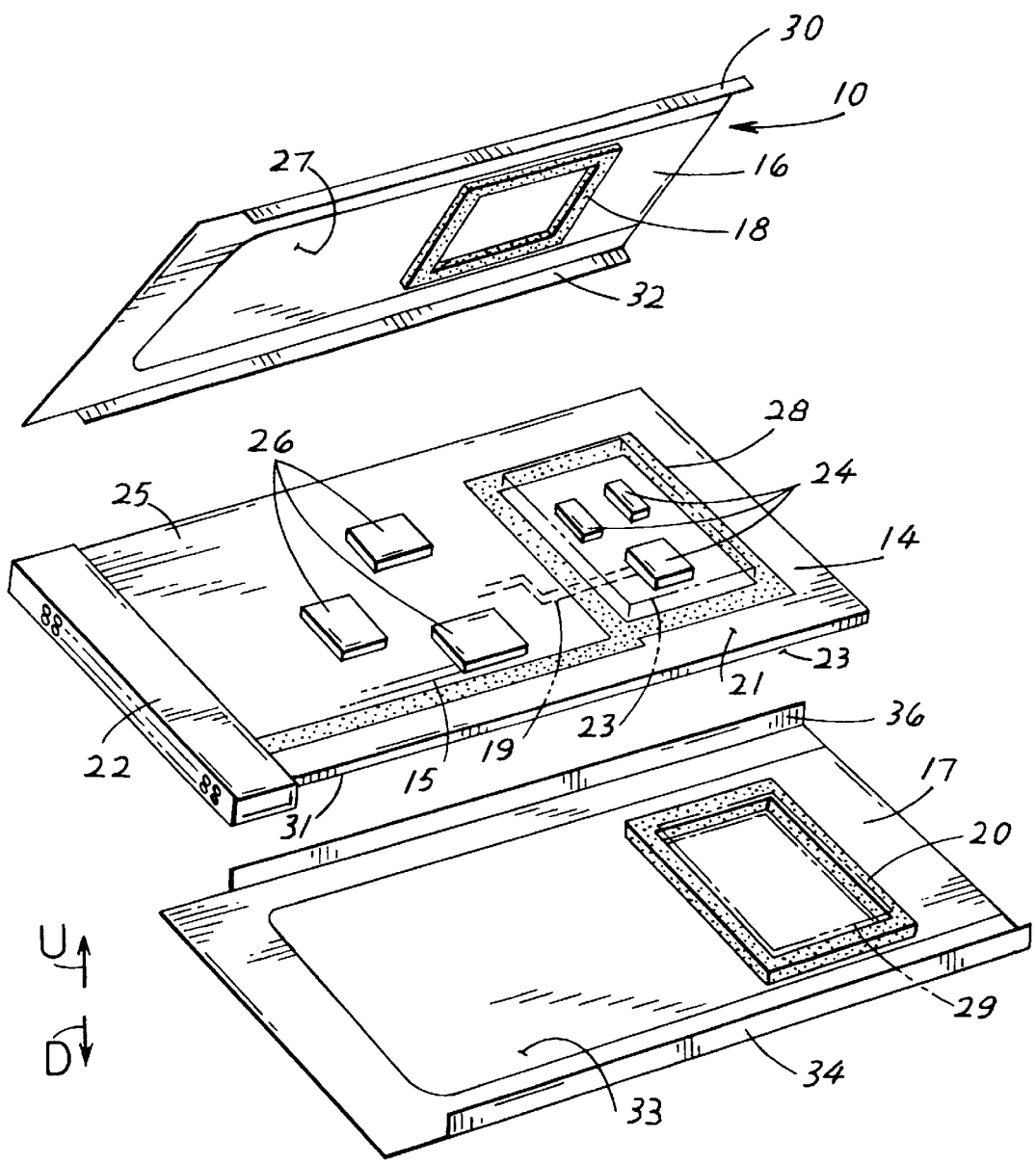
FIG. 1 is an exploded isometric view of a PC card constructed in accordance with the invention.

FIG. 1 shows a PC card (card with printed circuit board) comprising a two-part housing 10 and a printed circuit board 14. The housing includes top and bottom cover halves or cover parts 16, 17 that are each stamped from stainless steel sheet metal. Upper and lower gaps 21, 23 lie between the circuit board faces and the cover parts. A pair of molded internal shields 18, 20 are provided, in the form of rectangular walled enclosures, with each shield being shown attached to a corresponding one of the cover parts. Each internal shield is formed from an electrically conductive elastomer, for example, CHO-SEAL of 1310 Parker Hannifin Plc. This material contains silver plated particles and provides excellent electrical conductivity. Each internal shield is secured to one of the covers by means of an electrically conductive adhesive, such as CHO-BOND 1030 of Parker Hannifin Plc. The adhesive cures on exposure to air to form a nonreleasable joint.

A front end connector 22 is mounted at the front end of the circuit board. Circuit components 24, 26 are mounted on the circuit board and are connected to signal traces 15, 18 on the board. The components 24 form circuitry that is to be shieded to prevent radiation or reception of interfering electromagnetic energy to other circuitry on the board, such as circuitry that includes circuit components 26. To do this, a shielding volume 23 is defined in the upper gap 21, which extends from an area on the circuit board upper face 25 and upwardly beyond the board face, to substantially the inner face 27 of the upper cover part. A similar shielded volume 29 lies in the lower gap 23 between the board lower face 31 and substantially the inner face 33 of the lower cover part.

The circuit board 14 has a grounding trace 28 which is arranged to make contact with the internal shield 18 when the PC card is assembled. To assemble the PC card, the board is placed in the bottom cover part 17 and the top cover part 16 is then snapped onto the bottom cover part. Such snap attachment is made by cooperating sidewalls 30, 32, 34, 36 of the cover parts. A similar grounding trace may be provided on the lower side of the board for contact with the shield 20. The internal shields 18, 20 may be provided with a releasable adhesive coating on the shield surface opposite the cover part, such as Parker Hannifin 1085 adhesive. This permits the housing to be opened without damage to the shield or circuit board. The use of a conductive adhesive to secure the shield, assures reliable low resistance electrical conductivity between the shield, the housing, and the grounding trace.

Figure 2:
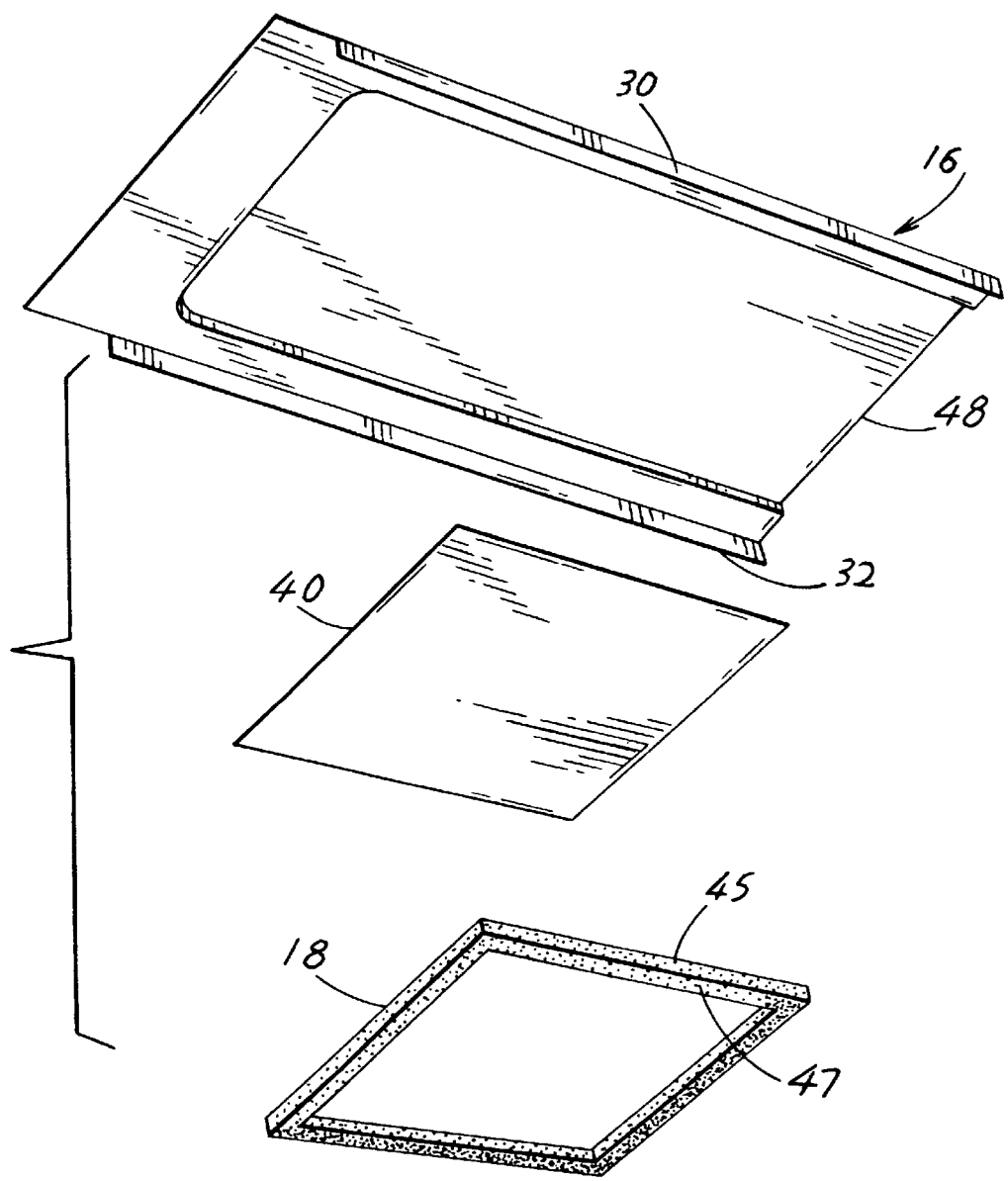
FIG. 2 is a partial exploded bottom view of a refinement of the PC card of FIG. 1.
Figure 3:
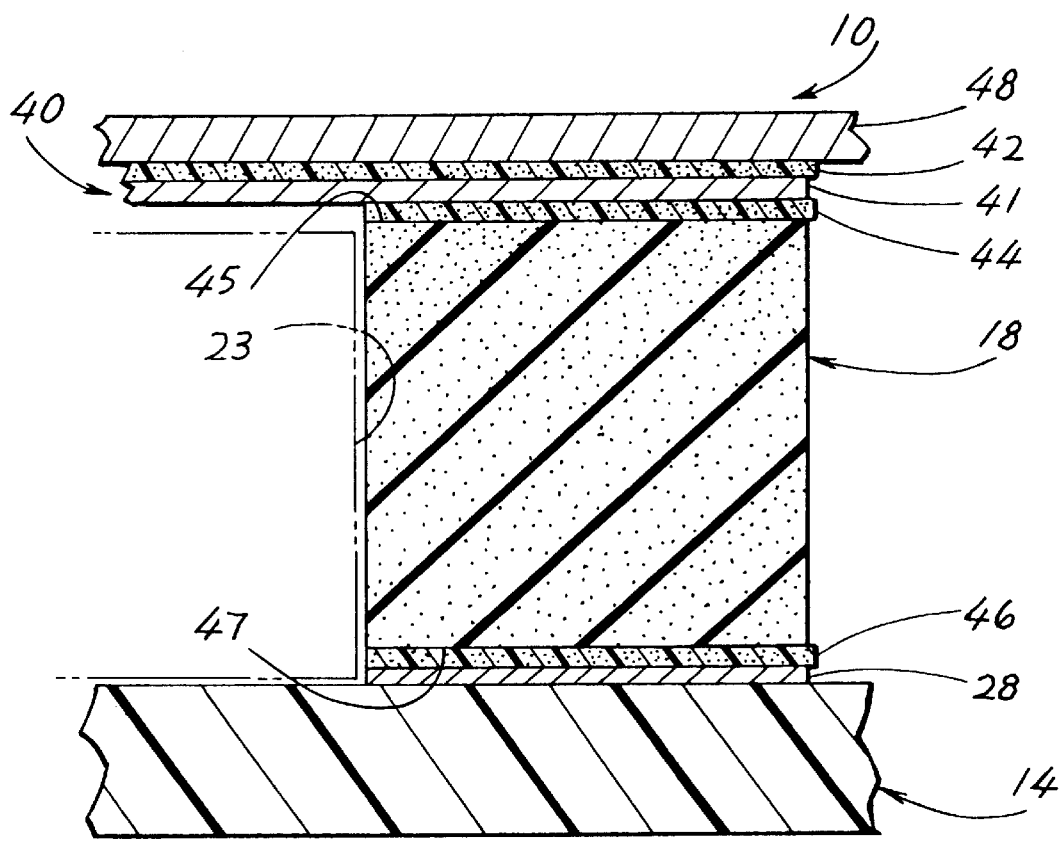
FIG. 3 is an enlarged sectional view of the refinement of FIG. 2, and also showing the parts assembled on a circuit board.

FIG. 2 shows a plate-like shield device 40 that can be mounted at the upper surface 45 of the internal shield 18, opposite the lower surface 47 that engages the grounding trace on the circuit board. As shown in FIG. 3, the shielding device 40 includes a metal foil 41 such as a copper foil, which is coated on its opposite surfaces with conductive adhesive layers 42, 44. The conductive adhesive may be Parker Hannifin 1085, which comprises an acrylic pressure sensitive adhesive with conductive particles embedded therein. The molded flexible internal shield 18 is secured to the foil through the adhesive layer 44. The shielding device, including the foil 41, extends over the entire top of the shielded volume 23 and against the upper surface of the internal shield 18. The shielding device forms the top of a Faraday cage to enhance the shielding or screening of circuitry on the circuit board. Enhanced screening is achieved because a copper foil has a smoother surface than the brushed stainless steel surface of the cover parts, and because copper has a higher conductivity, resulting in a lower resistance connection between the internal shield 18 and the foil 41. The internal shield 18 is secured to the grounding trace 28 on the circuit board 14 by means of a conductive adhesive layer 46.

Figure 4:
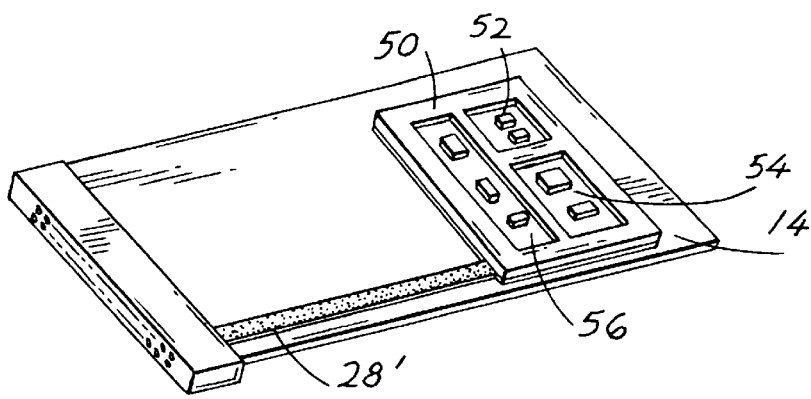
FIG. 4 is an isometric view of a circuit board with a conductive shield of another embodiment of the invention thereon.

FIG. 4 shows a circuit board 14 and another internal shield 50 which forms three enclosures 52, 54, 56. One or more circuit components lies within each enclosure, and circuit components in the different enclosures are screened from one another and from circuitry outside the internal shield against electromagnetic interference. The shield 50 is secured to a conductive grounding trace 28' on the circuit board by a conductive adhesive such as one of the adhesives previously mentioned.

Figure 5:
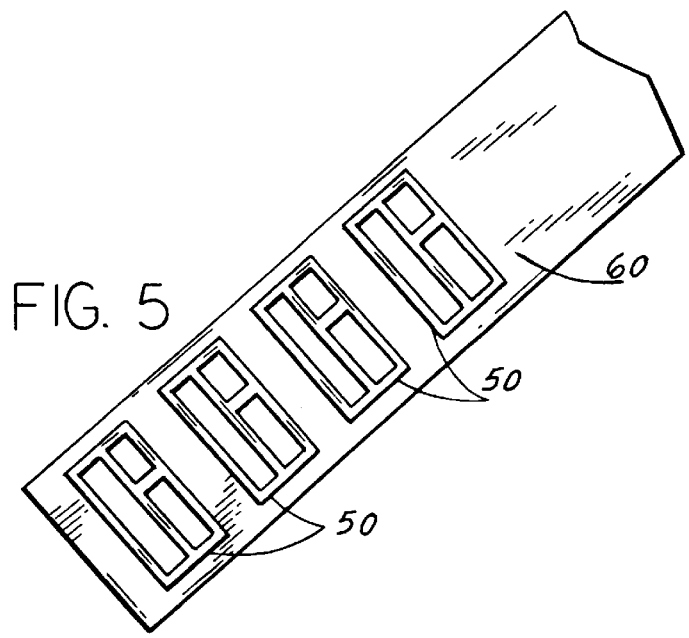
FIG. 5 shows a carrier liner strip provided with internal shields for use in the manufacture of PC cards.

FIG. 5 illustrates a carrier strip 60 on which numerous internal shields 50 are releasably secured by releasable adhesive. In manufacture, this allows the shields to be transferred to a cover part or a circuit board after application of a conductive adhesive to the exposed surface, or after application to an adhesive already on the cover or circuit board. This permits direct transfer of the shields without damage or distortion and enables automatic application by machine. It will be appreciated that in a construction where a metal foil is employed to enhance the shielding, such foils could be similarly provided on a carrier strip such as 60 and automatically applied to a shield fitted to a board or cover.

The internal shield can be permanently secured by a conductive adhesive to the printed circuit board grounding trace or to a cover part, before assembly. Securement to the opposite trace or cover can be effected by a permanent setting conductive adhesive or by a releaseable conductive adhesive. Both sides could be secured by a releasable conductive adhesive to facilitate placement of a shield. The adhesive may be applied to the internal shield or to the trace or cover part. The adhesive may be applied from a tube just prior to assembly. The conductivity between internal shield and cover and/or trace is ensured without the requirement for compressive pressure. Various compressive fillers are available such as copper and graphite, and different molded elastomers are available for the shield such as polystyrene. The flexible conductive shield can be molded directly onto the circuit board or cover. Although the embodiments described employ a single internal shield on each face of the circuit board, a shield may be provided on one side only, or several shields may be provided on one or both sides of the circuit board.

Figure 6:
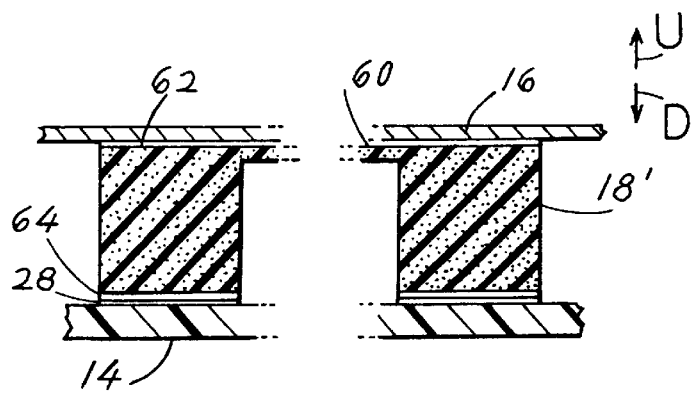
FIG. 6 is a sectional view of a portion of a circuit board, a top cover part, and an internal shield with a shielding device at the top, constructed in accordance with another embodiment of the invention.

FIG. 6 illustrates another arrangement, where a shielding device 60 is integrally molded with the internal shield 18'. Layers 62, 63 of adhesive bond the combination of internal shield 18' and the shielding device 60 to the board trace 28 and to the upper cover part 16.

Although terms such as "top" and "bottom" and arrows U, D (for up and down) are used to aid in the description of the parts as illustrated, the PC card can be made and used in any orientation with respect to the Earth.

Thus, the invention provides an internal PC card shield assembly that electromagnetically shields, or screens, circuit components in the card from one another without creating a local rigidized card area that could cause damage to the circuit board when the PC card flexes. The apparatus includes an internal shield of flexible and preferably elastomeric material which is electrically conductive. Elastomeric material has the advantage that it can compress and elongate to accommodate different thicknesses of the gap between the circuit board and cover part when the cover flexes. The thickness of the internal shield is at least half the thickness of the space between a face of a circuit board and an inner face of a sheet metal cover half, and preferably at least 90% of such thickness. Upper and lower surfaces of the shield are joined by electrically conductive adhesive to the circuit board and to a corresponding cover part. A shielding device can be used to cover the face of the shield opposite the circuit board, independently of the cover part. Such shielding device may include a continuous foil sheet held by a first adhesive layer to the shield and preferably held by another adhesive layer to the cover part.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A PC card comprising:

a housing having first and second sheet metal cover parts, with each cover part having a cover part inner face;

a circuit board mounted in said housing, said circuit board having opposite faces and having a shielded volume lying on and beyond a first of said faces, with said circuit board first face having a ground trace extending around said shielded volume;

a flexible electrically conductive inner shield lying in a first gap between said first face of said circuit board and a first cover inner face of said first cover part and forming a shield wall that extends completely around said shield volume;

said shield having opposite shield surfaces lying adjacent to said first circuit board face at said ground trace thereon and adjacent to said first cover part inner face, and including a layer of electrically conductive adhesive coupling at least one of said shield surfaces to at least one of said faces at said gap.

2. The PC card described in claim 1, wherein:

said at least one layer of adhesive includes two layers of adhesive that each couples a different one of said shield surfaces to one of said faces at said gap, with at least one of said layers of adhesive bring releasable to permit opening of the PC card without damage to the printed circuit board or the shield.

3. The PC card described in claim 2 wherein:

one of said layers of adhesive is a permanent non releasable type to maintain securement of the shield.

4. The PC card described in claim 1 wherein:

said shield is formed from an electrically conductive elastomeric material.

5. The PC card described in claim 1:

said shield is a molded part which has walls forming a plurality of enclosures within said shielded volume.

6. The PC card described in claim 1 including:

a shielding device that includes a sheet of electrically conductive material that lies over the entire volume of said shielded volume and which is electrically connected to said internal shield.

7. The PC card described in claim 6 wherein:

said shielding device comprises a metal foil and a pair of films of adhesive that join said adhesive respectively to said internal shield and to said first cover inner face.

8. A PC card that includes a circuit board having upper and lower faces and a cover that includes upper and lower sheet metal cover parts with inner faces facing said circuit board, and with an imaginary shielded volume extending from a limited area on said upper face of said board to substantially said upper cover part, the improvement comprising:

a shield of electrically conductive material extending around said shielded volume, said shield having upper and lower ends;

said circuit board having a ground trace and said shield lower end being engaged with said ground trace;

said shield being flexible so it can bend when said cover parts bend.

9. The PC card described in claim 8 including:

a plurality of signal traces on said circuit board;

a plurality of circuit components that are each connected to one of said signal traces, with at least one of said circuit components lying within said shielded volume and with at least another of said circuit components lying outside said shielded volume.

10. The PC card described in claim 8 including:

upper and lower layers of electrically conductive adhesive that couple said inner shield respectively to said first cover inner surface and to said ground trace.

11. The PC card described in claim 10 wherein:

at least one of said layers is formed of releasable adhesive.

12. The PC card described in claim 8 including:

an electrically conductive shielding device that lies under said first cover part and that lies over all of said shielded volume and that extends and is attached to said shield upper end.

13. A method for manufacturing a PC card, comprising:

forming a circuit board with a grounding trace on an upper face of said board so the grounding trace surrounds the bottom of a shielded volume that lies on and extends beyond said upper face of said board;

securing a flexible electrically conductive inner shield to said grounding trace by means of an electrically conductive adhesive so said inner shield surrounds said shielded volume;

placing a top sheet metal cover part over said first face of said board and placing a bottom sheet metal cover part over an opposite face of said board, and electrically coupling said inner shield to an inner face of said top sheet metal cover part.

14. The method described in claim 13 including:

constructing said inner shield to form a plurality of enclosures within said shielded area.

15. The method described in claim 13, including:

adhering first and second layers of electrically conductive adhesive on the opposite surfaces of a metal foil that lies over all of said shielded volume, securing said first adhesive layer to an inner surface of said first cover part and securing said second adhesive layer to a top surface of said inner shield.

* * * * *